United States Patent
Tong et al.

(10) Patent No.: US 6,757,147 B1
(45) Date of Patent: Jun. 29, 2004

(54) PIN-TO-PIN ESD-PROTECTION STRUCTURE HAVING CROSS-PIN ACTIVATION

(75) Inventors: Paul C. F. Tong, San Jose, CA (US); David Kwong, Fremont, CA (US); Ping Ping Xu, San Jose, CA (US)

(73) Assignee: Pericom Semiconductor Corp., San Jose, CA (US)

( * ) Notice: Subject to any disclaimer, the term of this patent is extended or adjusted under 35 U.S.C. 154(b) by 102 days.

(21) Appl. No.: 10/063,622

(22) Filed: May 3, 2002

(51) Int. Cl.[7] .................................................. H02H 3/22
(52) U.S. Cl. ........................................ 361/111; 361/54
(58) Field of Search .......................... 361/54, 56, 91, 361/111; 257/355, 357, 360, 365, 366

(56) References Cited

U.S. PATENT DOCUMENTS

| | | | |
|---|---|---|---|
| 4,870,530 A | 9/1989 | Hurst et al. ................ 361/91 |
| 4,978,869 A | 12/1990 | Dias ........................... 307/443 |
| 5,214,562 A * | 5/1993 | Levi ........................... 361/212 |
| 5,616,943 A | 4/1997 | Nguyen ....................... 257/355 |
| 5,625,519 A * | 4/1997 | Atkins ......................... 361/93.7 |
| 5,646,808 A | 7/1997 | Nakayama ................... 361/56 |
| 5,672,896 A | 9/1997 | Lee et al. .................... 257/360 |
| 5,701,024 A | 12/1997 | Watt ............................ 257/360 |
| 5,780,905 A | 7/1998 | Chen et al. .................. 257/355 |
| 5,841,619 A * | 11/1998 | Shigehara et al. ........... 361/111 |
| 5,910,725 A * | 6/1999 | Gist ............................ 323/313 |
| 5,917,336 A * | 6/1999 | Smith et al. ................. 326/30 |
| 5,946,177 A * | 8/1999 | Miller et al. ................. 361/56 |
| 6,046,897 A * | 4/2000 | Smith et al. ................. 361/111 |
| 6,118,640 A * | 9/2000 | Kwong ........................ 361/56 |
| 6,306,695 B1 | 10/2001 | Lee et al. .................... 438/152 |
| 6,385,021 B1 * | 5/2002 | Takeda et al. ............... 361/56 |

* cited by examiner

Primary Examiner—Jonathan Salata
(74) Attorney, Agent, or Firm—Stuart T. Auvinen

(57) ABSTRACT

A cross-pin electro-static-discharge (ESD) protection device protects against ESD zaps between two I/O pins. Pin A is connected to a drain of a bus-switch transistor and pin B is connected to the transistor's source. An ESD protection device on pin A has an n-channel shunting transistor to an internal ground bus. The gate of the shunting transistor is a cross-gate node that is capacitivly coupled to pin A, and has a leaker resistor to ground. An n-channel cross-grounding transistor has its gate connected to the same cross-gate node, but it connects the internal ground bus to pin B, which is grounded in the pin-to-pin ESD test. An ESD pulse on pin A drives the cross-gate node high, turning on both the shunting transistor and the cross-grounding transistor. The floating internal ground bus is connected to ground by pin B, grounding the substrate of the bus-switch transistor to prevent its turn-on.

20 Claims, 4 Drawing Sheets

US 6,757,147 B1

PIN-TO-PIN ESD-PROTECTION STRUCTURE HAVING CROSS-PIN ACTIVATION

BACKGROUND OF INVENTION

This invention relates to integrated circuits (IC's), and more particularly to pin-to-pin electro-static-discharge (ESD) protection structures.

Relatively small electric shocks that might not be noticed by a human can melt or otherwise destroy tiny structures in an integrated circuit (IC). To reduce such damage, input and output pads of IC chips are typically connected to protection devices specifically designed to shunt electro-static-discharges (ESD). These ESD-protection devices are effective when the ESD pulse is applied to an input or output (I/O) pin when the ground pin is connected to a ground.

During testing for ESD-protection, an ESD test machine applies a positive or negative test to the device-under-test (DUT) with its pins configured in various combinations (see JESD22-A114-B for details). This can include a zap to an I/O pin while the ground pin is connected to the ESD machine as a ground.

Since an actual electric shock can occur between any two pins on a chip, full ESD testing usually includes applying an ESD pulse between every possible combination of two pins. Other pins of the chip can be left floating.

ESD-protection devices are usually designed to shunt ESD current from a pin to a power or ground bus. When the ground is floating the ESD-protection device may not work optimally. For example, when an ESD pulse is applied between two different I/O pins, and the power and ground pins are left floating, the ESD current must somehow travel from the one I/O pin to the other I/O pin. Often an indirect path carries the ESD pulse, such as an internal ground bus.

Such I/O-pin to I/O-pin ESD testing can be the most difficult test to pass, especially for Bus-Switch-type products. While "normal" I/O pin to ground or I/O-pin to power tests may pass, ESD pulses between two I/O pins with the ground pin floating may cause damage. This damage can sometimes result in leakage on a pin after the ESD test.

FIG. 1 is a diagram of a prior-art chip with grounded ESD-protection devices on each I/O pin. Pin A and pin B are I/O pins on an IC chip. Pins A and B are connected by bus-switch transistor 10 which forms a connecting channel when its gate is driven high by inverter 18. When enable EN is high, inverters 16, 18 drive the gate of bus-switch transistor 10 high, connecting pins A, B. When EN is low, transistor 10 isolates pin A from pin B.

ESD protection device 12 is connected to pin A. A wide variety of ESD protection devices could be used. ESD protection device 12 includes structures to shunt an ESD pulse from pin A to an internal ground bus. The shunt could be provided by a large diode to ground, or by a large grounded-gate n-channel transistor (either thin gate oxide or field oxide gate could be used), or by some other structure.

When an ESD pulse is applied to pin A, and the ground pin is grounded, ESD protection device 12 shunts the ESD pulse to the internal ground, and then to the ground pin and back to the ESD tester (or other common ground). ESD protection device 12 protects bus-switch transistor 10 from damage by the ESD pulse.

Pin B is likewise protected by ESD protection device 14. During normal operation in a real system, when EN is low and bus-switch transistor 10 isolated pins A, B, ESD protection device 12 can shunt any shock applied to pin A to the internal ground. This prevents the shock from being coupled to pin B, which may be coupled to another active bus. Such shocks can occur during hot-swapping of PC or network cards.

ESD-Protection Can Fail When internal Ground Floats—FIG. 2

While ESD protection devices 12, 14 provide good protection when the internal ground is connected to an external ground, protection can be poor when the internal ground is floating. FIG. 2 highlights failure of ESD-protection devices when the internal ground is floating. In this I/O-pin to I/O pin ESD test the power and ground pins are left floating. The ESD machine is connected between pin A and pin B. The ESD pulse is applied to pin A while pin B is grounded. All other pins, including power and ground, are left floating.

The ESD pulse applied to pin A charges up any capacitances on pin A until a high enough voltage is reached so the ESD protection device 12 snaps back and conducts. Then the ESD pulse charges internal ground bus 20. Internal ground bus 20 connects to other ESD protection devices including ESD protection device 14 for the grounded pin B. The ESD pulse then travels in the forward direction through ESD protection device 14 to reach pin B.

Internal ground bus 20 has some resistance, as does ESD protection device 14 and especially ESD protection device 12, which has to snapback before conduction occurs. The total potential drop in this discharge path can be equal to the sum of the Snapback voltage of protection device 12 plus the IR drop across internal ground bus 20 plus the forward voltage of protection device 14.

The n+ drain, p-substrate, and n+ source of bus-switch transistor 10 form parasitic lateral NPN transistor 22. The drain of bus-switch transistor 10 at pin A receiving the ESD zap is the collector, the source at pin B, which is grounded is the emitter, and the p-substrate is the base of NPN transistor 22. Since internal ground bus 20 is floating during the pin-to-pin ESD test, the p-substrate, which is normally grounded, is also floating. Thus NPN transistor 22 has a floating or open base.

The floating base lowers the breakdown voltage of NPN transistor. The open-base breakdown voltage is known as $BV_{CEO}$ to indicate the open (O) base condition. This open-base breakdown can be lower than the snapback or turn-on voltage of ESD protection device 12.

Thus NPN transistor 22 can conduct before ESD protection device 12 conducts during a pin-to-pin ESD test. Since NPN transistor 22 is simply a parasitic device and is not designed to carry the high ESD current, various material failures can occur, permanently damaging the IC.

To prevent such damage, NPN transistor 22 and bus-switch transistor 10 can have a more rugged design. For example, the source and drain contacts can be moved farther from the gate edge, or a larger channel length can be used, effectively increasing the base-width of parasitic NPN transistor 22. However, these design changes can increase the capacitance and ON resistance, which is undesirable. Even with these design changes, bus-switch transistor 10 may still fail the I/O-pin to I/O-pin ESD test.

A related application for "ESD-isolation Circuit Driving Gate of Bus-Switch Transistor During ESD Pulse Between Two I/O Pins", filed Mar. 7, 2002, U.S. Ser. No. 09/683,968 describes improving ESD immunity of a bus-switch transistor by actively driving the transistor gate during an ESD event. While useful, additional ESD is desired. The present invention can be used in conjunction with the related application or separately.

What is desired is improved ESD protection. Better ESD protection is desired for I/O-pin to I/O-pin ESD tests when ground and the substrate is floating. An isolation circuit for a bus-switch transistor is desired that is activated during I/O-pin to I/O-ESD tests or similar conditions.

DETAILED DESCRIPTION

The present invention relates to an improvement in ESD protection. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors have realized that the breakdown voltage of the parasitic NPN transistor of a bus-switch transistor can be Improved by more directly connecting the p-substrate (the base of the parasitic NPN) to ground. During the pin-to-pin ESD test, one pin (B) is at ground. So the inventors add a cross-grounding transistor between pin B and the internal ground bus. This cross-grounding transistor is turned on by the ESD protection device protecting the other pin (A).

Figure 1:
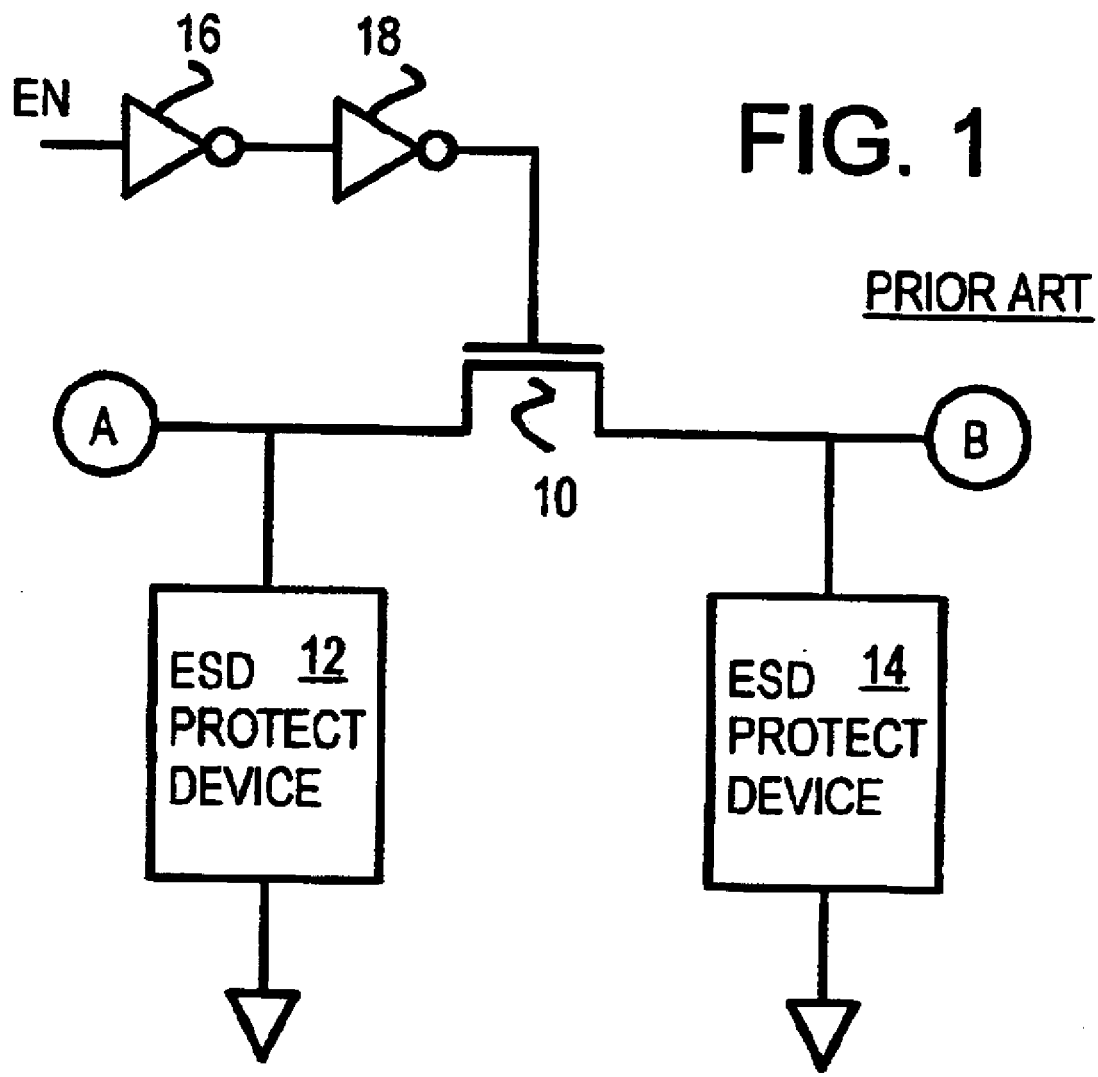
FIG. 1 is a diagram of a prior-art chip with grounded ESD-protection devices on each I/O pin.
Figure 2:
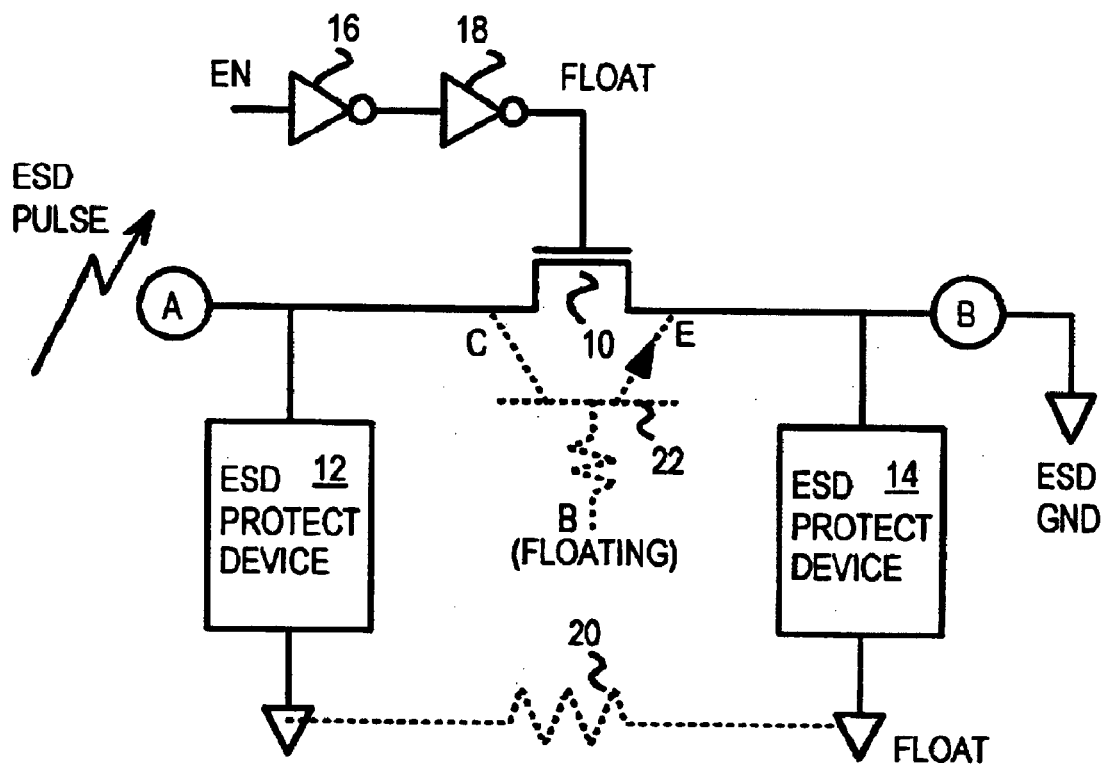
FIG. 2 highlights failure of ESD-protection devices when the internal ground is floating.
Figure 3:
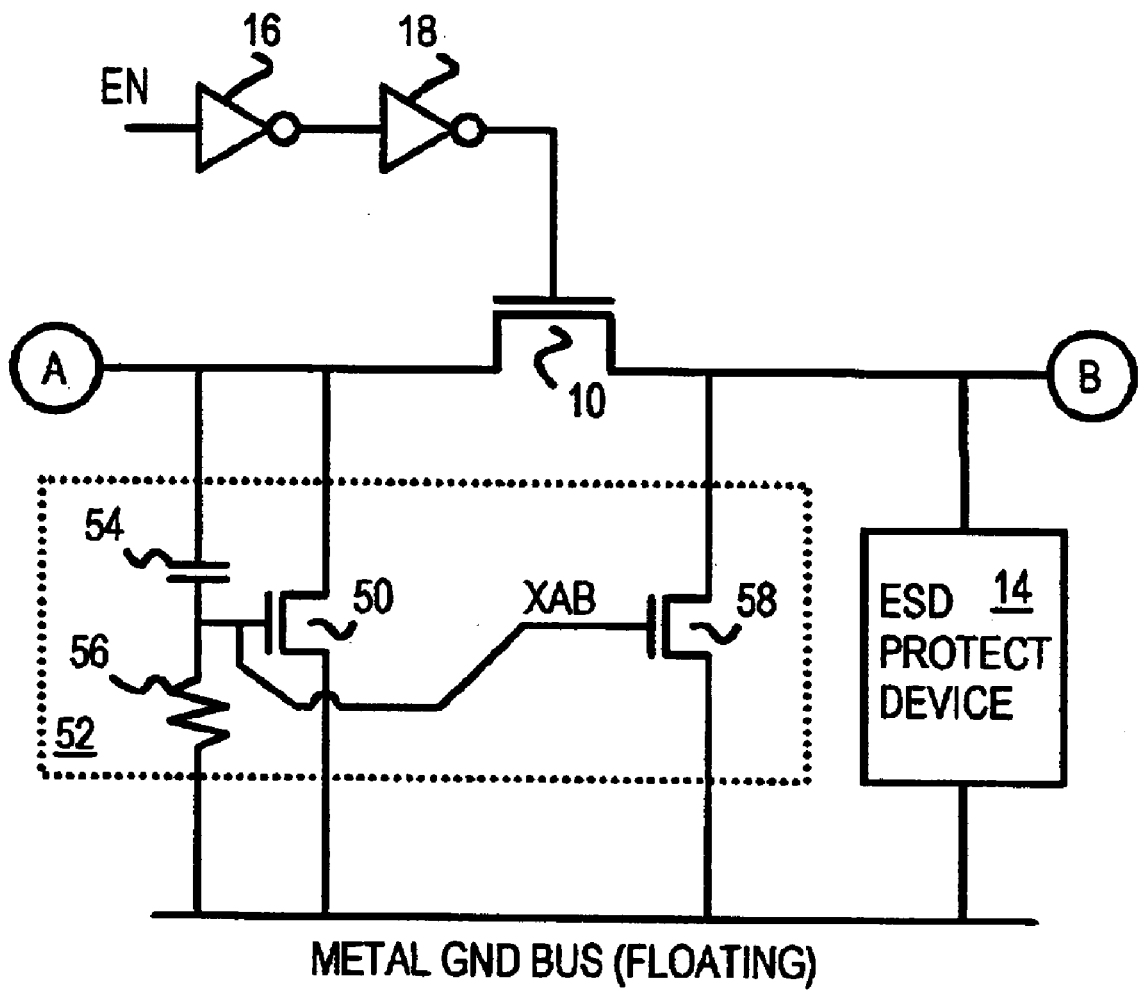
FIG. 3 is a diagram of a bus-switch transistor with cross-grounding ESD protection.

FIG. 3 is a diagram of a bus-switch transistor with cross-grounding ESD protection. Pins A and B are connected by the channel of bus-switch transistor 10, which has a gate driven by inverter 18, which inverts an enable signal EN that is first inverted by inverter 16. Enable signal EN is normally floating during an ESD test.

Cross-pin ESD protection device 52 protects bus-switch transistor 10 when an ESD pulse is applied to pin A. A traditional ESD protection device 14 protects pin B in this embodiment.

Cross-pin ESD protection device 52 includes n-channel shunting transistor 50, which has a gate that is driven high by capacitive coupling from an ESD pulse applied to pin A. Capacitor 54 couples a sufficient portion of the ESD pulse to the gate of n-channel shunting transistor 50 to turn it on during the ESD event.

Gate-discharge resistor 56 allows the charge coupled to the gate of n-channel shunting transistor 50 to be discharged to the internal ground bus. The values of resistor 56 and capacitor 54 are chosen so that transistor 50 remains on sufficiently long to discharge most of the ESD pulse applied to pin A. Eventually resistor 56 discharges all of the coupled ESD charge to the internal ground, turning transistor 50 off at the end of the ESD event. During normal operation, resistor 56 keeps the gate of transistor 50 grounded, preventing transistor 50 from turning on.

N-channel cross-grounding transistor 58 shares the same gate node XAB with n-channel shunting transistor 50. Both transistors 50, 58 have sources connected to the internal ground bus, but shunting transistor 50 has its drain connected to pin A, while cross-grounding transistor 58 has its drain connected to the other pin B.

Although they share a common gate node XAB, cross-grounding transistor 58 is located some distance from shunting transistor 50. Since the ESD-protection structures are normally located near the pins being protected, cross-grounding transistor 58 is located near pin B while shunting transistor 50 is located near pin A. When pin A and pin B are adjacent, the distance is relatively small, just one pad-to-pad pitch, perhaps 75 microns or smaller. However, when pin A and pin B are not adjacent, the distance can be much greater.

Gate node XAB can include a metal line between transistors 50, 58, as well as shorter connectors of polysilicon or other material to the gates themselves. Since the gates are isolated and gate node XAB does not shunt the ESD pulse itself, a relatively small current is carried and the metal line does not have to be exceedingly large and can be relatively small, such as twice the minimum metal line-width.

When an ESD zap is applied to pin A when pin B is grounded during an I/O-pinto-I/O-pin ESD test, capacitor 54 charges gate node XAB. Once the voltage of gate node XAB rises a transistor threshold above ground, cross-grounding transistor 58 turns on, since its source is grounded by pin B. Under this bias condition, the drain of cross-grounding transistor 58 is connected to the internal ground bus. Cross-grounding transistor 58 thus connects the internal ground bus to the grounded pin B.

Directly connecting the internal ground bus to the grounded pin B causes the p-substrates, which are connected to the internal ground bus by substrate taps, to be grounded during the ESD test. The base of the parasitic NPN transistor under bus-switch transistor 10 is thus grounded rather than open, improving the breakdown voltage of the NPN transistor (i.e. BVceo becomes BVces). This keeps the parasitic NPN transistor from turning on too early. BVces greater than BVceo allows n-channel shunting transistor 50 to go into snapback mode (Vsnapback).

Instead, the rising voltage of gate node XAB turns on n-channel shunting transistor 50. Connecting the internal ground bus to the grounded pin B essentially re-directs the ESD current through n-channel shunting transistor 50 rather than through bus switch transistor 10 because n-channel shunting transistor 50 can snapback (Vsnapback) at a much lower value compared to the BVces value of the parasitic NPN transistor under bus-switch transistor 10. A gate-coupling effect in n-channel shunting transistor 50 helps to lower its snapback voltage (Vsnapback).

Once n-channel shunting transistor 50 snaps back, the ESD pulse applied to pin A is shunted to the internal ground bus and then through a forward conducting n-channel transistor in ESD protection device 14 to pin B, rather than through bus-switch transistor 10 or its parasitic NPN transistor.

Figure 4:
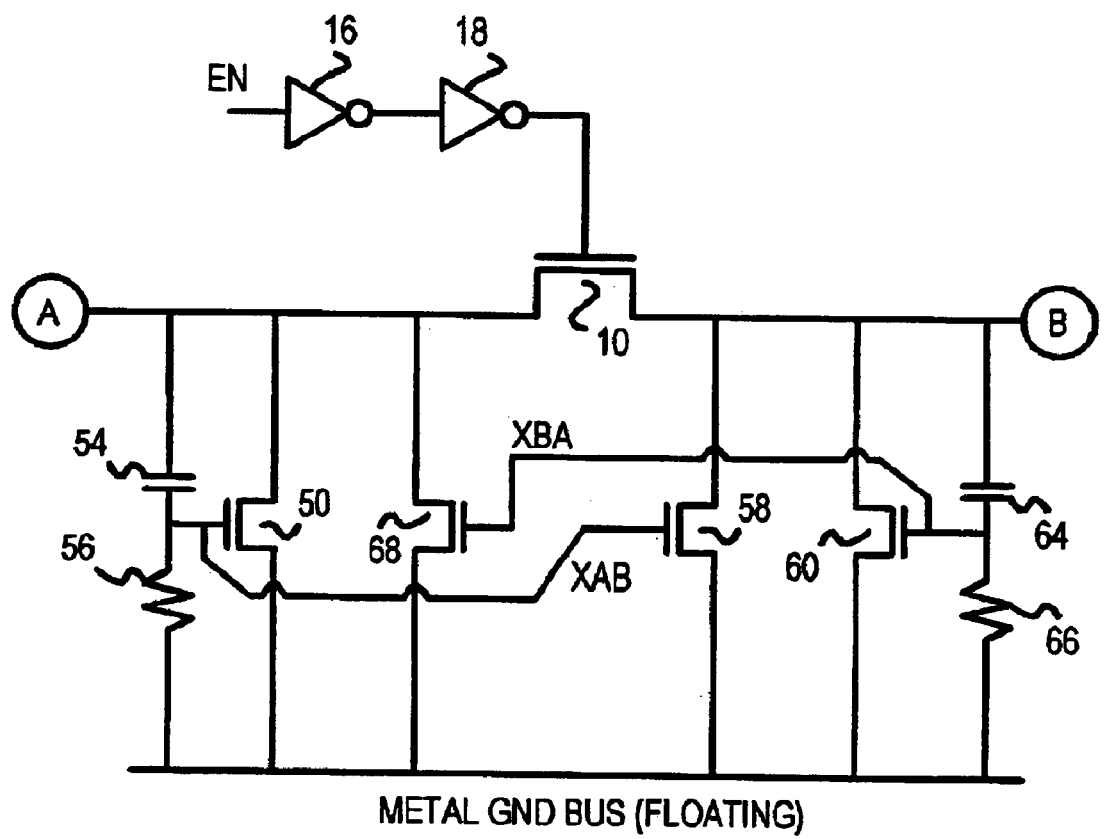
FIG. 4 shows bi-directional cross-grounding ESD protection for a bus-switch transistor.

FIG. 4 shows bi-directional cross-grounding ESD protection for a bus-switch transistor. Pins A and B are connected by the channel of bus-switch transistor 10, which has a gate driven by inverter 18, which inverts an enable signal EN that is first inverted by inverter 16. Enable signal EN is normally floating during an ESD test.

Capacitor 54, resistor 56, shunting transistor 50, and cross-grounding transistor 58 protect bus-switch transistor 10 when an ESD pulse is applied to pin A as described for FIG. 3. Gate node XAB turns on both transistors 50, 58 when the ESD pulse is applied to pin A.

For the reverse ESD test, the positive ESD pulse is applied to pin B, and pin A is grounded. Then capacitor 64 charges reverse gate node XBA with a portion of the ESD zap applied to pin B. Before resistor 66 discharges reverse gate node XBA, cross-grounding transistor 68 turns on, connecting grounded pin A to the internal ground bus and substrate taps.

N-channel shunting transistor 60 also has its gate driven high since its gate is also reverse gate node XBA. The ESD pulse on pin B is shunted to the internal ground through the snapback of n-channel shunting transistor 60 and then through forward-conducting n-channel transistor 50 to the grounded pin A.

The internal ground bus can rise in voltage above the grounded pin A, even when cross-grounding transistor 68 is on. However, the rise in voltage of the internal ground bus is much less than If it were left floating. The internal ground bus is still sufficiently "grounded" even though it may be some voltage above the absolute ESD ground on pin B. The ESD ground itself may be above an machine ground inside the ESD machine, and could be a floating ground relative to other equipment in a lab room. ESD protection is still improved, even when a smaller, more resistive transistor is used for cross-grounding transistor 68 because the bulk of the ESD current is discharged through forward conducting n-channel transistor 50.

The size of the grounding transistors can be relatively small, since a relatively small current is needed to ground the internal ground bus and p-type substrates. When the shunting transistor of pin A turns on and dumps the ESD charge onto the internal ground bus, then the other shunting transistor of pin B can turn on to carry the larger ESD charge to pin B. Thus the grounding transistor does not have to carry the large ESD charge since the shunting transistor is connected in parallel.

ALTERNATE EMBODIMENTS

Several other embodiments are contemplated by the inventors. For example the cross-grounding transistors could be replaced with bipolar transistors, as could the n-channel shunting transistors. The bases of the bipolar transistors replace the gates, since the bases control current flow between the collector and emitter. Of course, some current can flow through bipolar bases so the cross-gate node may be discharged more quickly. Diodes, resistors, capacitors, and other transistors could be added to the circuits. Additional protection devices could be added.

The invention could be applied to other types of IC chips rather than a bus switch chip. For example, a network switch might have a matrix of bus-switch transistors that connect input pins and output pins in a cross-bar manner, with an input connected to multiple outputs by multiple bus-switch transistors. Additional cross-grounding transistors could be added, one for each output pin, that are driven by the same gate node of the input pin's ESD protection device. The invention could also protect ordinary inputs, outputs, and I/O's that are not directly connected by bus-switch transistors, but are connected by ordinary logic gates.

P-channel rather than n-channel transistors could be used for N-well processes. The invention could be re-designed to connect to the internal power-supply bus rather than to the internal ground bus, and protect a p-channel bus-switch transistor. Both a p-channel and an n-channel ESD protection device could be used in parallel to protect a transmission gate bus switch.

Other kinds of transistors could also be used. Sizing of transistors and capacitors can be estimated and verified or adjusted based on simulation results. Each I/O pin could be an input, output, or a bi-directional pin.

Many bus-switch transistors and isolation circuits can be integrated together on a single substrate and sold as a single chip. Other functions and circuits can be included on the chip. The pin can be a bonding pad on a semiconductor chip that is for connecting to a bonding wire or ball that electrically connects to a pin or connector of a package. The terms source and drain can change, depending on applied voltage biases. Current can be positive current or negative current flowing in an opposite direction.

The leaker resistor could be replaced by other leaker devices, such as transistors. The coupling capacitors can be implemented as p-channel or n-channel transistors each with the source and drain connected together as one terminal of the capacitor, and the transistor gate as the second capacitor terminal.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. 37 C.F.R. § 1.72(b). Any advantages and benefits described may not apply to all embodiments of the invention. When the word "means" is recited in a claim element, Applicant intends for the claim element to fall under 35 USC § 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein performing the function and their structural equivalents, but also equivalent structures. For example, although a nail and a screw have different structures, they are equivalent structures since they both perform the function of fastening. Claims that do not use the word means are not intended to fall under 35 USC § 112, paragraph 6. Signals are typically electronic signals, but may be optical signals such as can be carried over a fiber optic line.

The foregoing description of the embodiments of the invention has been presented for the purpose of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A cross-pin electro-static-discharge (ESD) protection device comprising:

a first pad, connected to a first internal node, for connecting to an external device, the first pad receiving a positive ESD pulse during a pin-to-pin ESD test;

a second pad, connected to a second internal node, for connecting to an external device, the second pad receiving an ESD ground during the pin-to-pin ESD test;

an internal ground bus, connected to a ground pad but not connected to the first or second pad, wherein the internal ground bus is floating during the pin-to-pin ESD test;

a first shunting transistor, coupled to shunt ESD current from the first internal node to the internal ground bus when the positive ESD pulse is applied to the first pad;

a coupling capacitor, coupled between the first internal node and a cross-gate node, for charging the cross-gate node when the positive ESD pulse is applied to the first pad; and a first grounding transistor, being activated by the cross-gate node, for connecting the internal ground bus to the second internal node to dynamically apply the ESD ground to the internal bus during the pin-to-pin ESD test;

whereby the internal ground bus is grounded to the second pad by the first grounding transistor, while ESD current from the first pad is shunted to the internal ground bus by the first shunting transistor.

2. The cross-pin ESD protection device of claim 1 wherein the cross-gate node connects to a gate of the first shunting transistor and to a gate of the first grounding transistor, whereby the first shunting transistor and the first grounding transistor share a common gate node, even though current is conducted from different pads.

3. The cross-pin ESD protection device of claim 2 wherein the first shunting transistor is an n-channel transistor and the first grounding transistor is an n-channel transistor.

4. The cross-pin ESD protection device of claim 3 further comprising:

a leaker resistor, coupled between the cross-gate node and the internal ground bus, whereby the cross-gate node is discharged by the leaker resistor.

5. The cross-pin ESD protection device of claim 3 further comprising:

a bus-switch transistor coupled to conduct current between the first internal node and the second internal node during normal operation, but for isolating the first internal node from the second internal node during the pin-to-pin ESD test;

whereby the bus-switch transistor is protected from the positive ESD pulse by the first shunting transistor.

6. The cross-pin ESD protection device of claim 5 wherein the bus-switch transistor is an n-channel transistor having a substrate coupled to the internal ground bus;

whereby the substrate of the bus-switch transistor is biased to the ESD ground by the first grounding transistor and the internal ground bus during the pin-to-pin ESD test.

7. The cross-pin ESD protection device of claim 6 wherein an n-type source, the substrate which is p-type, and an n-type drain of the bus-switch transistor form a parasitic NPN transistor;

wherein a breakdown voltage of the parasitic NPN transistor of the bus-switch transistor is made more positive by the first grounding transistor connecting the substrate to the ESD ground during the pin-to-pin ESD test.

8. The cross-pin ESD protection device of claim 5 further comprising:

a second shunting transistor, coupled to shunt ESD current from the second internal node to the internal ground bus when the positive ESD pulse is applied to the second pad;

a second coupling capacitor, coupled between the second internal node and a reverse cross-gate node, for charging the reverse cross-gate node when the positive ESD pulse is applied to the second pad; and a second grounding transistor, being activated by the reverse cross-gate node, for connecting the internal ground bus to the first internal node to dynamically apply the ESD ground to the internal ground bus during a reverse pin-to-pin ESD test;

whereby the internal ground bus is grounded to the first pad by the second grounding transistor, while ESD current from the second pad is shunted to the internal ground bus by the second shunting transistor.

9. The cross-pin ESD protection device of claim 8 wherein the second shunting transistor and the second grounding transistors are n-channel transistors having gates connected to the reverse cross-gate node.

10. The cross-pin ESD protection device of claim 9 further comprising:

a second leaker resistor, coupled between the reverse cross-gate node and the internal ground bus.

11. A bus-switch chip comprising:

a first input;

a second input;

an internal bus that is isolated from the first and second inputs;

bus-switch transistor means for conducting current between the first input and the second input when activated by an enable signal during normal operation;

first coupling means for coupling a portion of a first voltage shock applied to the first input to a first activating node;

first shunting means, responsive to the first activating node, for shunting current from the first input to the internal bus when the first coupling means couples the portion of the first voltage shock to the first activating node; and first clamping means, responsive to the first activating node, for clamping the internal bus to the second input when the first coupling means couples the portion of the first voltage shock to the first activating node, whereby the first shunting means and the first clamping means are activated by the first activating node.

12. The bus-switch chip of claim 11 further comprising:

second coupling means for coupling a portion of a second voltage shock applied to the second input to a second activating node;

second shunting means, responsive to the second activating node, for shunting current from the second input to the internal bus when the second coupling means couples the portion of the second voltage shock to the second activating node; and second clamping means, responsive to the second activating node, for clamping the internal bus to the first input when the second coupling means couples the portion of the second voltage shock to the second activating node, whereby the second shunting means and the second clamping means are activated by the second activating node.

13. The bus-switch chip of claim 12 wherein the second clamping means comprises a second n-channel transistor means for conducting current between the first input and the internal bus when the second activating node receives the portion of the second voltage shock, wherein the first activating node is a gate of the second n-channel transistor means.

14. The bus-switch chip of claim 13 wherein the first shunting means comprises a third n-channel transistor means for conducting current between the first input and the internal bus when the first activating node receives the portion of the first voltage shock, wherein the first activating node is a gate of the third n-channel transistor means;

wherein the second shunting means comprises a fourth n-channel transistor means for conducting current between the second input and the internal bus when the second activating node receives the portion of the second voltage shock, wherein the second activating node is a gate of the fourth n-channel transistor means.

15. The bus-switch chip of claim 14 wherein the bus-switch transistor means comprises a fifth n-channel transistor means for conducting current between the first input and the second input, wherein the enable signal is a gate of the fifth n-channel transistor means;

wherein the internal bus is a ground bus that connects to a substrate under the fifth n-channel transistor means.

16. The bus-switch chip of claim 15 wherein the first and second coupling means comprise capacitors, further comprising:

first leaker means, coupled to the first activating node, for leaking charge from the first activating node to the internal bus;

second leaker means, coupled to the second activating node, for leaking charge from the second activating node to the internal bus.

17. An electro-static-discharge (ESD) protection circuit comprising:

an internal bus;

a bus-switch transistor having a gate driven by an enable signal, a drain coupled to a first input, a source coupled to a second input, and a substrate coupled to the internal bus by substrate taps;

a first capacitor between the first input and a first gate node;

a first shunt transistor having the first gate node as its gate, a drain coupled to the first input and a source coupled to the internal bus;

a first remote transistor having the first gate node as its gate, a drain coupled to the second input and a source coupled to the internal bus.

18. The ESD protection circuit of claim 17 further comprising:

a second capacitor between the second input and a second gate node;

a second shunt transistor having the second gate node as its gate, a drain coupled to the second input and a source coupled to the internal bus;

a second remote transistor having the second gate node as its gate, a drain coupled to the first input and a source coupled to the internal bus.

19. The ESD protection circuit of claim 18 further comprising:

a first resistor coupled between the first gate node and the internal bus;

a second resistor coupled between the second gate node and the internal bus.

20. The ESD protection circuit of claim 17 wherein the bus-switch transistor is an n-channel transistor, the first and second shunt transistors are n-channel transistors and the first and second remote transistors are n-channel transistors.

* * * * *